(12) United States Patent
Khanifar et al.

(10) Patent No.: US 8,928,404 B2
(45) Date of Patent: Jan. 6, 2015

(54) AMPLIFIER PERFORMANCE STABILIZATION THROUGH PREPARATORY PHASE

(75) Inventors: Ahmad Khanifar, Laguna Hills, CA (US); Yatin Buch, Tustin, CA (US); George Sideris, Irvine, CA (US); Khurram Sheikh, San Clemente, CA (US); Alexander Rabinovich, Cypress, CA (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 13/468,976

(22) Filed: May 10, 2012

(65) Prior Publication Data

US 2012/0286866 A1 Nov. 15, 2012

Related U.S. Application Data

(60) Provisional application No. 61/486,121, filed on May 13, 2011.

(51) Int. Cl.
| | |
|---|---|
| *H03F 1/26* | (2006.01) |
| *H03F 3/60* | (2006.01) |
| *H03F 1/02* | (2006.01) |
| *H03F 1/30* | (2006.01) |
| *H03F 1/32* | (2006.01) |
| *H03F 3/24* | (2006.01) |
| *H04B 1/04* | (2006.01) |

(52) U.S. Cl.
CPC .............. *H03F 3/602* (2013.01); *H03F 1/0288* (2013.01); *H03F 1/30* (2013.01); *H03F 1/3247* (2013.01); *H03F 3/245* (2013.01); *H03F 2200/198* (2013.01); *H03F 2200/321* (2013.01); *H03F 2200/447* (2013.01); *H04B 2001/0425* (2013.01)
USPC .......................... 330/149; 330/289; 330/124 R

(58) Field of Classification Search
CPC ...... H03F 1/302; H03F 1/30; H03F 2200/447; H03F 1/301; H03F 3/19; H03F 2200/18; H03F 1/0261; H03F 1/3247; H03F 1/3241; H03F 1/3229; H03F 2201/3233; H03F 1/3276
USPC .............. 330/289, 149, 285, 296, 295, 124 R
See application file for complete search history.

(56) References Cited

U.S. PATENT DOCUMENTS

| | | | | |
|---|---|---|---|---|
| 7,375,588 | B2 * | 5/2008 | Yamakawa et al. | 330/289 |
| 8,174,314 | B2 * | 5/2012 | Koren | 330/149 |

* cited by examiner

*Primary Examiner* — Hieu Nguyen
(74) *Attorney, Agent, or Firm* — Schwegman Lundberg & Woessner, P.A.

(57) ABSTRACT

A method and related systems for amplifier performance stabilization of a digitally predistorted RF power amplifier are disclosed. The characteristics of power amplifiers change as a function of temperature making adaptive digital predistortion highly problematic during initial application of an RF signal to a power amplifier. Embodiments disclose a method and systems in which the power amplifier is taken through a preparatory phase before the RF signal is applied to the power amplifier and the digital predistortion calculation starts. This is achieved by increasing the quiescent current of the power stages beyond nominal values for a rapid warm up and readjusting to its normal bias point when the radio frequency signal is applied and the digital predistortion is turned on.

14 Claims, 6 Drawing Sheets

AMPLIFIER PERFORMANCE STABILIZATION THROUGH PREPARATORY PHASE

RELATED APPLICATION INFORMATION

The present application claims priority under 35 U.S.C. Section 119(e) to U.S. Provisional Patent Application Ser. No. 61/486,121 filed May 13, 2011, the disclosure of which is incorporated herein by reference in its entirety.

BACKGROUND OF THE INVENTION

1. Field of the Invention

This present invention is related in general to methods and structures for power amplifier systems. More particularly, the invention is directed to methods and structures for stabilizing power amplifier performance.

2. Description of the Prior Art and Related Background Information

Due to the temperature dependence of transistor parameters, the performance of solid state devices changes considerably with temperature. A drift in transconductance is known to decrease the linear gain but the effects are far reaching and cause changes in nonlinear transfer characteristics of the power amplifier ("PA") subassembly in general. As an example, in a CMOS transistor, there is a drift in gate threshold voltage of around 2 mV/° C. Silicon LDMOS transistors, which are widely used in cellular communications infrastructure, exhibit such behavior. A similar effect can be identified in current-controlled current source devices such as bipolar transistors and other field effect transistors ("FET").

Most amplifier circuits compensate for this drift by employing bias-compensating circuitry. These circuits generate a gate bias voltage that varies with temperature having a gradient opposite to that of the amplifying device. While such prior art remedies are widely used in practice, the amplifier characteristics still change considerably. In a typical linearized multi-stage PA system, the magnitude of linear gain drift can be as large as 10 dB over the system's operating temperatures. This linear gain drop is compensated by automatically increasing the input drive level. However, the deterioration in intermodulation distortion ("IMD") performance and increase of out of band emissions must be compensated by the linearizer. A well-designed linearization system can constantly monitor the output and dynamically compensate for temperature-related changes.

A closer look at the prior art for bias circuit compensation points to analog solutions. In one solution, an n-p-n transistor is placed very close to the amplifying device to have a near identical temperature exposure. Resistors define the slope of the compensation. (See, for example, Electronic Devices and Circuits: Principles and Applications, by Deshpande, Mc Graw-Hill, reprint 2008, ISBN10:0-07-061711-2).

More recently, with the aid of microprocessors and digital potentiometers, the bias circuits have changed considerably. (See Intersil, X96011 Sensor Bias Conditioner IC, Application note AN174.2, http://www.intersil.com/data/an/an174.pdf, Apr. 20, 2006). In a microprocessor-controlled bias circuit, the $V_{GS}$ (or $V_{BE}$) variation vs. temperature is characterized and the compensated values are stored in a microprocessor's nonvolatile memory. A temperature sensor is used in proximity to the RF power transistors and feeds the temperature data back to the microcontroller. Based on this information the microcontroller calculates the appropriate gate bias voltage and applies this voltage directly to the RF transistor gate.

A hybrid of the above two approaches is also occasionally used. In such a scenario the microcontroller sets the initial quiescent bias value and provides the appropriate switching sequences. A p-n-p or n-p-n transistor is used for the temperature drift compensation in an analog circuit.

In another more recent approach that is commercially available, all the functions needed to control the PA chain are designed into a single application-specific integrated circuit ("ASIC"). (See Maxim, MAX1386, Dual RF LDMOS Bias Controllers with I²C/SPI Interface, http://www.maxim-ic.com/datasheet/index.mvp/id/5155/t/al). Such a solution achieves gate bias voltage accuracy to within a few microvolts of resolution for self-calibration. An EEPROM is organized to store a lookup table and register information required to start up and maintain the bias conditions over a wide range of temperatures and output powers. In this approach rather than only measuring device package temperature, the integrated bias circuit monitors device current ($I_D$), voltage, and temperature, logically deciding if the DAC output voltage should be adjusted to maintain the bias setting. Such bias controllers offer self-calibration modes to minimize error over time and with variations in temperature and supply voltage.

The application of the bias-temperature controllers outlined above helps with device dynamics and as outlined previously this operation is totally independent of the linearization engine running in parallel. It might be reasonable to claim that the bias stabilization circuitries assist PA linearization in a nearly steady-state thermal condition but they can be unhelpful in initial phase of operation or in a PA-DPD's startup process.

Accordingly, a need exists to stabilize power amplifier performance.

SUMMARY OF THE INVENTION

In a first aspect, the present invention provides a method for stabilizing performance of a power amplifier, comprising determining an operating temperature of a power amplifier, setting the quiescent current of the power amplifier to a high level when the operating temperature is less than a pre-defined level, and feeding an RF signal into the input of the power amplifier when the operating temperature is greater than or equal to the pre-defined level. The method further comprises adjusting the quiescent current to its normal bias point when the RF signal is applied.

In a preferred embodiment, the method further comprises decoupling the RF signal from an input of the power amplifier during initialization. The method preferably further comprises applying predistortion to the RF signal after the operating temperature is greater than or equal to the pre-defined level. The high level of the quiescent current preferably corresponds to full power or higher of the amplifier device but within the safety range of drain current as defined by the device specifications. The method preferably further comprises measuring a total time period in which the quiescent current has been set to the high level, comparing the total time period to a pre-defined time, and feeding the RF signal to the input of the power amplifier when the total time period is greater than or equal to the pre-defined time. The method preferably further comprises maintaining the high level of the quiescent current of the power amplifier when total time period is less than the pre-defined time. The pre-defined time is preferably determined based on an ambient temperature near the power amplifier. The method preferably further comprises monitoring a current of the power amplifier, communicating the value of the current of the power amplifier, and varying the quiescent current of the power amplifier based on the value of the current.

In another aspect, the present invention provides a power amplifier system. The power amplifier system comprises a system controller, a first power amplifying device amplifying a communication signal to provide a first output signal, a first temperature sensor thermally coupled to the first power amplifying device and sensing and communicating the operating temperature of the first power amplifying device to the system controller, and a first bias circuit providing a first quiescent current to the first power amplifying device, the first bias circuit coupled to and controlled by the system controller. The system controller controls the first bias circuit to increase the first quiescent current of the first power amplifying device when the operating temperature is less than a pre-defined level.

In a preferred embodiment, the power amplifier system further comprises a first current sensing circuit monitoring a first current of the first power amplifying device, the first current sensing circuit communicating the value of the first current to the system controller, where the system controller varies the first quiescent current based on the value of the first current. The power amplifier system preferably further comprises a second power amplifying device amplifying a second portion of the communication signal to provide a second output signal, a second temperature sensor thermally coupled to the second power amplifying device and sensing and communicating the operating temperature of the second power amplifying device to the system controller, and a second bias circuit providing a second quiescent current to the second power amplifying device, the second bias circuit controlled by the system controller.

The system controller controls the second bias circuit to increase the second quiescent current of the second power amplifying device when the operating temperature is less than a pre-defined level. The first and second power amplifying devices are preferably configured to form a balanced amplifier system. The first and second power amplifying devices are preferably configured to form a Doherty amplifier system. The power amplifier system preferably further comprises a variable attenuator stage having an input receiving an RF signal and an output coupled to a common input of the first and second power amplifying devices, the variable attenuator stage controlled by the system controller. Optionally the system controller controls the variable attenuator stage for selectively coupling and decoupling the RF signal to the first and second power amplifying devices. The power amplifier system preferably further comprises a first variable attenuator stage having an input receiving an RF signal and an output coupled to an input of the first power amplifying device, the variable attenuator stage controlled by the system controller, and a second variable attenuator stage having an input receiving an RF signal and an output coupled to an input of the second power amplifying device, the variable attenuator stage controlled by the system controller. The system controller preferably selectively couples and decouples the RF signal to the first and second power amplifying devices.

In another aspect, the present invention provides a predistortion linearized amplifier system for amplifying a communication signal, comprising an input adapted to receive a communication signal, a digital predistorter coupled to the input and receiving the communication signal and outputting a predistorted signal, a system controller, and a variable attenuator stage having an input receiving the predistorted signal and an output, the variable attenuator stage attenuating or substantially decoupling the RF signal, the variable attenuator stage controlled by the system controller. The predistortion linearized amplifier system for amplifying a communication signal, further comprising a power amplifier coupled to the output of the variable attenuator stage and amplifying the predistorted signal to provide an output signal, an output sampling coupler coupled to the power amplifier and sampling the output signal to provide a sampled signal, a feedback circuit path coupled to the output sampling coupler and providing input to a predistortion training block of the digital predistorter, a temperature sensor thermally coupled to the power amplifier and communicating the operating temperature of the power amplifier to the system controller, and a bias circuit providing a quiescent current to the power amplifier, the bias circuit controlled by the system controller. When the operating temperature is less than a pre-defined level, the system controller controls the variable attenuator stage by decoupling the RF signal to the power amplifier and communicating commands to the bias circuit to increase the quiescent current of the power amplifier.

In a preferred embodiment, the system controller sends commands to the variable attenuator stage to feed the predistorted signal to the input of the power amplifier when the operating temperature is greater than or equal to the pre-defined level. The pre-defined level is preferably determined based on an ambient temperature near the power amplifier. The predistortion linearized amplifier system for amplifying a communication signal preferably further comprises a current sensing circuit monitoring a current of the power amplifier, the current sensing circuit communicating the value of the current to the system controller. The system controller is adapted to select the value of the quiescent current based on the value of the current. The system controller preferably controls the variable attenuator stage by sending commands to the variable attenuator stage based on a value of a time when the increased quiescent current is fed to the power amplifier.

Further features and aspects of the invention are set out in the following detailed description.

DETAILED DESCRIPTION OF THE INVENTION

The function of digital predistortion ("DPD") subsystem preceding a transmitter chain is not only to correct the power amplifier's ("PA") nonlinear behavior but also to track performance variations as a function of temperature and thus, adaptively restore and maintain the desired linear performance. During a transmitter's PA subsystem cold start, the DPD tries to estimate the predistortion coefficients based on samples of the output response while the PA is warming up and continually changing. These transitions interfere with the DPD system's functionality and slow down its algorithmic convergence. Embodiments disclose a method and its implementation in which the power amplifier is prepped before the radio frequency ("RF") signal is applied to the power amplifier and the DPD calculation starts. This is achieved by increasing the quiescent current of the power stages beyond nominal values for a rapid warm up and readjusting to its normal bias point when the radio frequency signal is applied and DPD is employed.

The procedure outlined above is particularly attractive in systems where the RF transceiver is not housed in a temperature controlled environment, examples of which are active antennas arrays, remote radio heads ("RRH"), and outdoor pico-cell radios. The approach outlined above will reduce the system idle time at cold start by prepping the PA module while the remote radio head is going through system checks and setup sequences. The overall scheme will enable the system to accept traffic and reach normal functionality in a short span of time.

Figure 1:
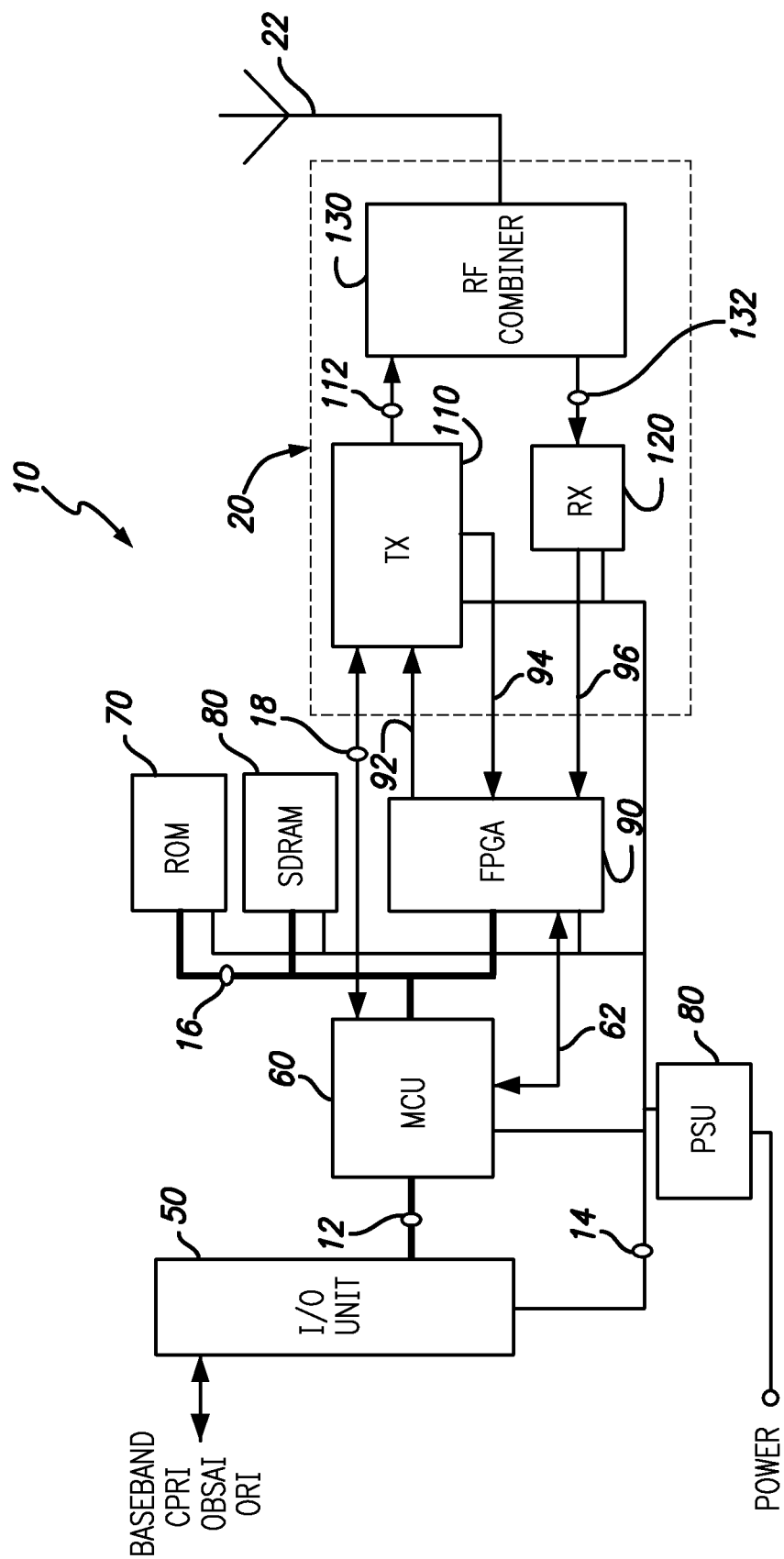
FIG. 1 is a block schematic diagram of digitally pre-distorted transceiver in an embodiment.

With reference to FIG. 1, a digitally predistorted transceiver ("DPD transceiver") 10 will now be described. DPD transceiver 10 receives downlink ("DL") base band encoded data from a Base Station ("BS") (not shown) via Common Public Radio Interface ("CPRI™") or alternately OBSAI, ORI, or other interface. The CPRI interface is a publicly available specification for the key internal interface of radio base stations between the Radio Equipment Control ("REC") and the Radio Equipment ("RE"), such as a DPD transceiver 10. As such, CPRI is used to send DL and receive uplink ("UL") data between BS and user equipment (UE) along with control information between REC and RE.

To communicate with REC, DPD transceiver 10 is provided with I/O unit 50 specifically adapted to receive and transmit signals via the CPRI interface. Numerous commercially available CPRI interface solutions are available at the present time. Overall I/O unit 50 provides physical interface between external CPRI interface and internal circuits via lines 12 for example. The I/O unit 50 is provided with required power from power supply 80 via lines 14 and interfaced with micro control unit ("MCU") 60.

MCU 60 performs data packet separation in the DL direction and aggregation in the UL direction on the CPRI packets. The MCU is responsible for handling and routing the user plane data, control and management ("C&M") plane data, and the synchronization plane data to and from the REC interface through CPRI interface. In the DL direction, user plane data is extracted and passed through via data bus 16 to the field programmable gate array ("FPGA") 90 which can provide many advantages in digital signal processing, including high density integration, parallel operation mechanisms, "DSP" functionality, and flexible algorithm implementation, which make the FPGA a favorite hardware choice for implementing baseband DPD, crest factor reduction ("CFR") suitable for use with RF PAs. A well known approach for DPD implementation system includes two main functional blocks, including 1) the DPD unit, which predistorts the input I/Q signal 62 and 2) a PA RF output observation 94 parameter extraction lines, which are used to initialize and update the correction coefficients. Both functional blocks can be readily implemented in FPGA 90 along with ROM 70 and SDRAM 80 used to store startup and operational values as needed. A common DPD approach is to calculate, update correction coefficients, and store results in a Look-Up Table ("LUT"), which may also contain the pre-distorted signal values. If the behavior of the PA 220 changes, a new set of pre-distorted signal values must be calculated and loaded into the LUT. Using this method, the distortions caused by PA nonlinear response can be effectively reduced.

It is a common practice for PA 220 stages to be operated in or near saturation to achieve best possible efficiency. When operated in such manner, PA 220 tends to exhibit dispersive response characteristics due to the high RF signal dynamics. This means, that thermal and electrical memory effects are present which LUT approach would require additional correction coefficient. This usually proves to be too complex to implement or, if attempted, consumes a majority of FPGA resources. To realize a practical DPD solution, DSP may be used for calculating and updating correction coefficients. It should be noted that the FPGA 90 may include a separate DSP module within or externally as required. As such, DSP is used to calculate correction coefficients by comparing input I/Q baseband signals 62 against PA output signals 94.

The output of FPGA 90 contains pre-distorted I/Q DL signals 92 coupled into a TX module 110. The TX module 110 contains baseband to RF conversion circuits, with further details which will be described below. In a preferred embodiment, TX module 110 has two RF outputs including a main amplified RF output 112 and an observation path 94 adapted to convert PA 220 amplified RF signals, via sampling coupler 230, to the FPGA 90 parameter extraction unit. Appropriate power voltages in lines 14 are provided along with the dedicated communication bus 18 connecting the MCU 60 and the TX module 110.

The TX module 110 DL RF output 112 is coupled to a conventionally designed RF combiner 130, which may employ a duplexer filter known in the art for use in frequency-division duplex ("FDD") wireless communication systems. FDD means that the transmitter and receiver operate at different carrier frequencies. Alternatively, for time-division duplexing ("TDD"), may employ TX-RX switching arrangement (not shown), allowing the up-link and down-link signals to share the same RF spectrum.

The UL RF signals received from user equipment ("UEs") (not shown) via an antenna 22 are duplex filtered and passed through lines 132 to RX receive module 120 which converts received RF signals to baseband I/Q signals 96, which are further processed by FPGA module 90 before being passed onward to BSS via CPRI interface. The TX module 110, the RF combiner 130, and the Rx receive module 120 form a transceiver subsystem 20.

Figure 2:
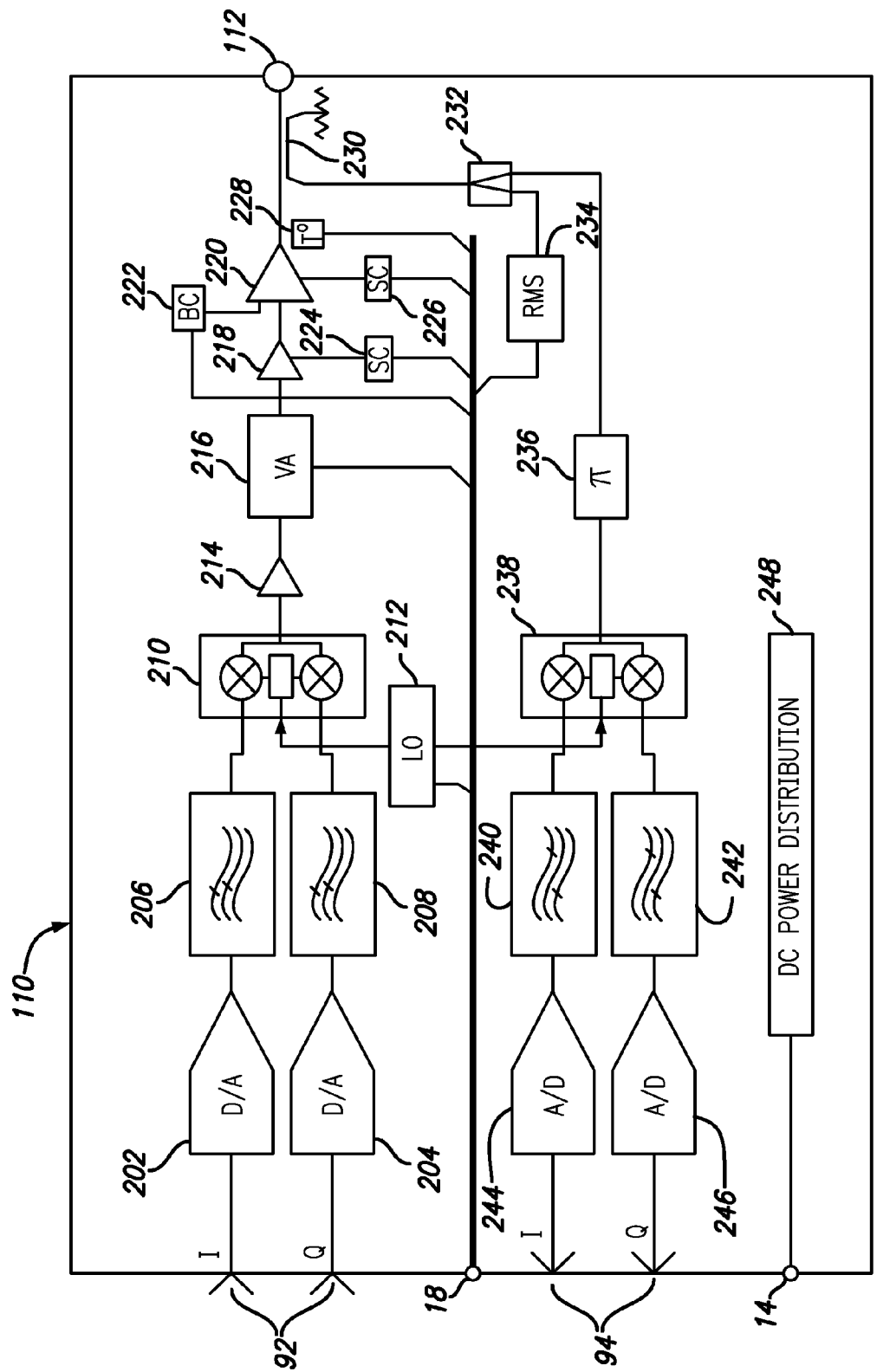
FIG. 2 is a block schematic diagram of a transceiver module in an embodiment.

With reference to FIG. 2, TX module 110 internal details will now be described with non limiting detail. TX module 110 provides DL conversion for baseband I/Q signals to RF. The pre-distorted I/Q signals 92 are coupled from DPD FPGA 90 into I/Q digital to analog ("D/A") converters 202 and 204. The outputs of the D/A converters 202 and, 204 are analog I/Q signals which are low pass filtered through filters 206 and 208 before being coupled into I/Q modulator 210. A suitable local oscillator ("LO") 212 is provided to up-convert DL base band signals to a desired RF spectrum. The output of the I/Q modulator 210 is a pre-distorted RF DL signal which is preferably amplified and filtered by the first stage amplifier 214 before being coupled into a variable attenuator stage 216.

Variable attenuator stage 216 may be implemented with a wide dynamic range RF signal attenuator and an RF switch which allows high degree of RF signal attenuation. The RF switch can be used to effectively mute and isolate subsequent gain stages such as amplifiers 218 and 220 without shutting down LO oscillator 212. This provides additional operational advantages. Operation of the variable attenuator stage 216 is implemented via communication bus 18, which may be implemented via any suitable peripheral communication bus such as: I2C, SPI, etc. The RF output of the variable attenuator stage 216 is coupled into a pre-driver gain stage amplifier 218 equipped with supply bias monitoring circuit 224. Preferably, pre-driver gain stage amplifier 218 is implemented using a high linearity, high gain stage (or a multi-stage) amplifier with sufficient output drive levels to drive high power output stage amplifier 220 to full output. The pre-driver gain stage supply bias monitoring circuit 224 can communicate via communication bus 18 and provide bias operational parameters back to MCU 60 and accept commands from MCU 60.

The high power output stage amplifier 220 will now be described. High power output stage amplifier 220 may employ a single RF transistor or a plurality of RF transistors arranged in a number configuration depending on application. Preferably, each transistor drain (or collector if bi-polar devices are used) current is monitored with a corresponding current sensing circuit 226. The current sensing circuit 226 is adapted to measure and provide measured current data back to the MCU 60 via communication bus 18. In addition, high power output stage amplifier 220 transistors are provided with monitoring and programmable bias circuit 222 which can alter transistor bias upon receiving a command from an MCU 60. Advantageously, programmable bias circuit 222 can provide back gate (or base) voltage and current values, if so required, back to the MCU 60. To monitor high power output stage amplifier 220 heatsink temperature, a temperature sensor 228 located in proximity of high power output stage amplifier 220 transistors may be employed. The temperature data from temperature sensor 228 is fed back to MCU 60.

It is reiterated here that in a PA subsystem cold start, the DPD tries to estimate the predistortion coefficients based on samples of the output response. This is while the PA is warming up and changing its characteristics. It is noted that, in this transitional phase, the DPD convergence is slowed down leading to occasional instability. An objective of preferred embodiments is to prevent such transitional phase and speed up system commissioning time.

Amplified DL RF signals from high power output stage 220 are coupled through directional sampling coupler 230 before being coupled through output 112 to RF combiner 130. The forward coupled port of the directional coupler 230 is coupled to a common port of the two way divider RF signal divider 232 which splits sampled DL RF signals into two paths. The first path is coupled to a RF signal detector 234, such as an RMS detector, while second path is coupled via signal level conditioning stage 236 into I/Q demodulator 238. I/Q demodulator 238 accepts sampled DL output RF signal from level conditioning stage 236 along with LO signal from LO 212. It should be noted LO 212 operation is controllable via communication bus 18.

The output signals from I/Q demodulator 238 are analog I/Q signals which are band pass filtered through filters 240 and 242 before being coupled into analog to digital ("A/D") converters 244 and 246. The ND converters 244 and 246 provide analog to digital signal conversion of observation path I/Q signals representative of the RF signal high power output stage (220) output. DC power supplies and distribution circuits 248 are provided as well known in the art.

Even though embodiments disclosed herein are directed for use with high performance DPD, it can be readily adapted and used with lower performance RF analog predistortion implementations, envelope tracking amplifiers and Feed-Forward Power Amplifiers (FFPA's), etc.

Figure 3:
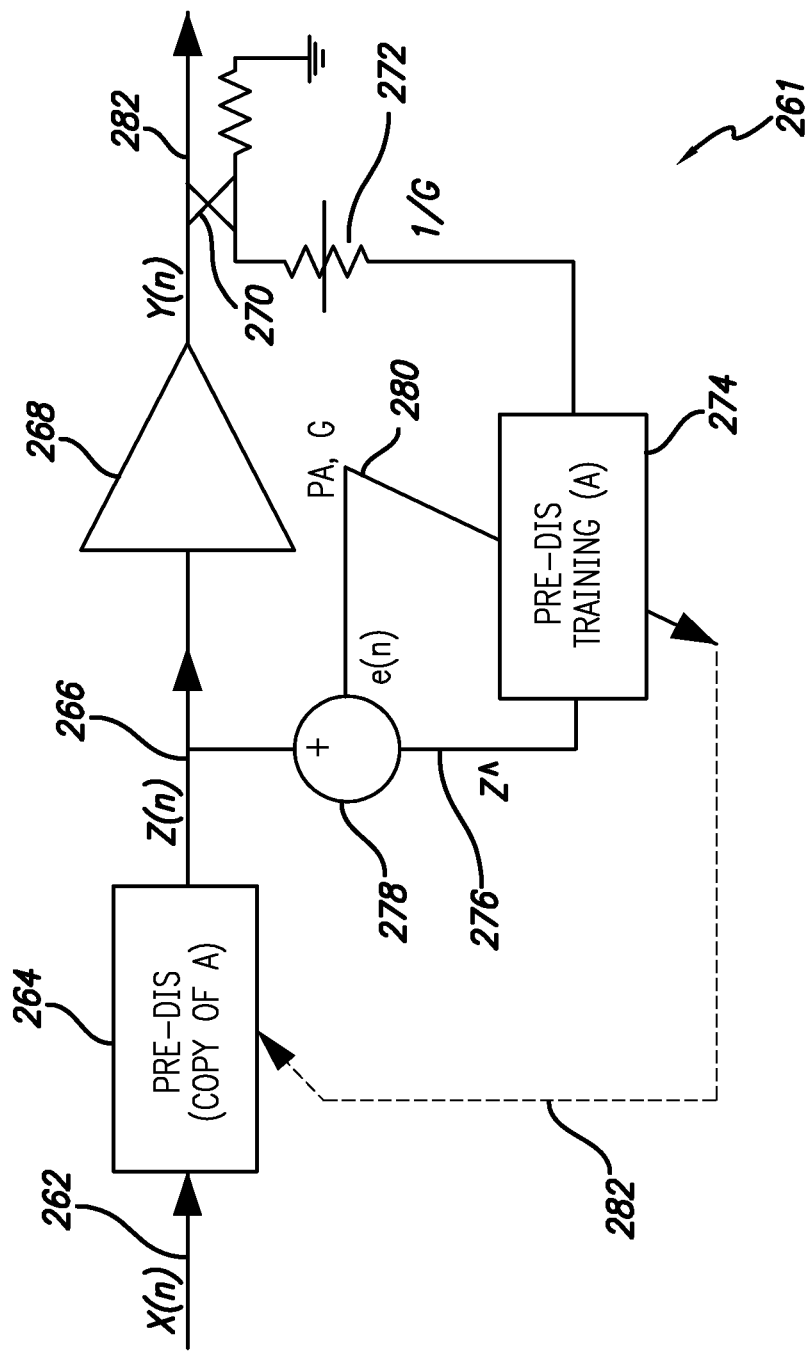
FIG. 3 is a block schematic diagram of a digital predistortion system using an indirect learning algorithm.

To illustrate the DPD functionality discussed above a typical high level DPD platform is conceptually shown in FIG. 3. The DPD system will precede the baseband modulator in the transmitter chain. The baseband is predistorted by a function that approximates the inverse of the transmitter and PA chain non-linear function. The block diagram of FIG. 3 is known as an Indirect Learning Architecture.

More specifically, FIG. 3 depicts a DPD subsystem 261 comprising a predistortion circuit 264, a power amplifier 268, and an output coupler 270. (In the specific embodiment of FIG. 1 these may be implemented in FPGA 90 and transmission subsystem 20.) Predistortion circuit 264 receives an input signal 262 and provides a predistorted signal 266 which is fed into power amplifier 268. The power amplifier 268 amplifies the predistortion signal to provide an output signal 282. The system further comprises a feedback path having a gain inverter 272, a predistortion training circuit 274, and a comparator 278. Comparator 278 receives the predistorted signal 266 and a fed back digital output signal 276 from the predistortion training circuit 274 to provide an error signal 280 which is employed by predistortion training circuit 274 to adaptively update predistortion coefficients. The predistortion circuit 264 and the predistortion training circuit are communicatively coupled via line 282 to provide the updated predistortion coefficients to predistortion circuit 264.

The characteristics of power amplifiers (PA) change as a function of temperature. The most noticeable changes are drift in gain and phase response, power output, efficiency and nonlinearity. The function of a DPD subsystem preceding the PA 268 is not only to correct the nonlinear behavior but also to track the PA's performance variations as a function of temperature and thus, adaptively restore and maintain the desired linear performance. In a PA subsystem cold start, the DPD tries to estimate the predistortion coefficients based on samples of the output response, and while the PA is warming up it continually updates the predistortion coefficients. These transitions compound the DPD functionality and slow down the algorithm convergence. The invention provides a method and its implementation in which the power amplifier is prepared before the radio frequency (RF) signal is applied to the power amplifier and the DPD calculation starts. This is achieved by increasing the quiescent current of the power stages beyond nominal values for a rapid warm up and readjusting to its normal bias point when the radio frequency signal is applied and DPD is turned on.

As discussed above, embodiments of the invention disclose a technique and a method for prepping the power amplifier for the DPD operation. The concept will now be elaborated for specific exemplary power amplifier modules ("PAM"s). PAMs typically are biased at class AB, i.e. the quiescent current of the final stage of a PAM is less than half of device saturation current ($I_{DSS}$). By implication, only once the RF input is applied will the device drain current increase to its nominal level and heat up the device. An example of such a power amplifier module is shown in the balanced amplifier of FIG. 4A.

Balanced and Doherty PAM are the most popular variations used in modern telecommunication infrastructure. In the Doherty stage of the PAM shown in FIG. 4B, a peaking amplifier is biased at class C such that the quiescent current of this stage is actually zero in the absence of applied RF power or at lower power drive levels. The peaking device will only experience full current swing when the PA is at its maximum peak power. On average due to variation of input signal envelope, the average current of the peaking amplifier ranges from a quarter to a third of that of the main amplifier stage. Thus, without the RF input the power consumption of the PA device is rather small and the PAM temperature would not be raised to its normal range.

Figure 4A:
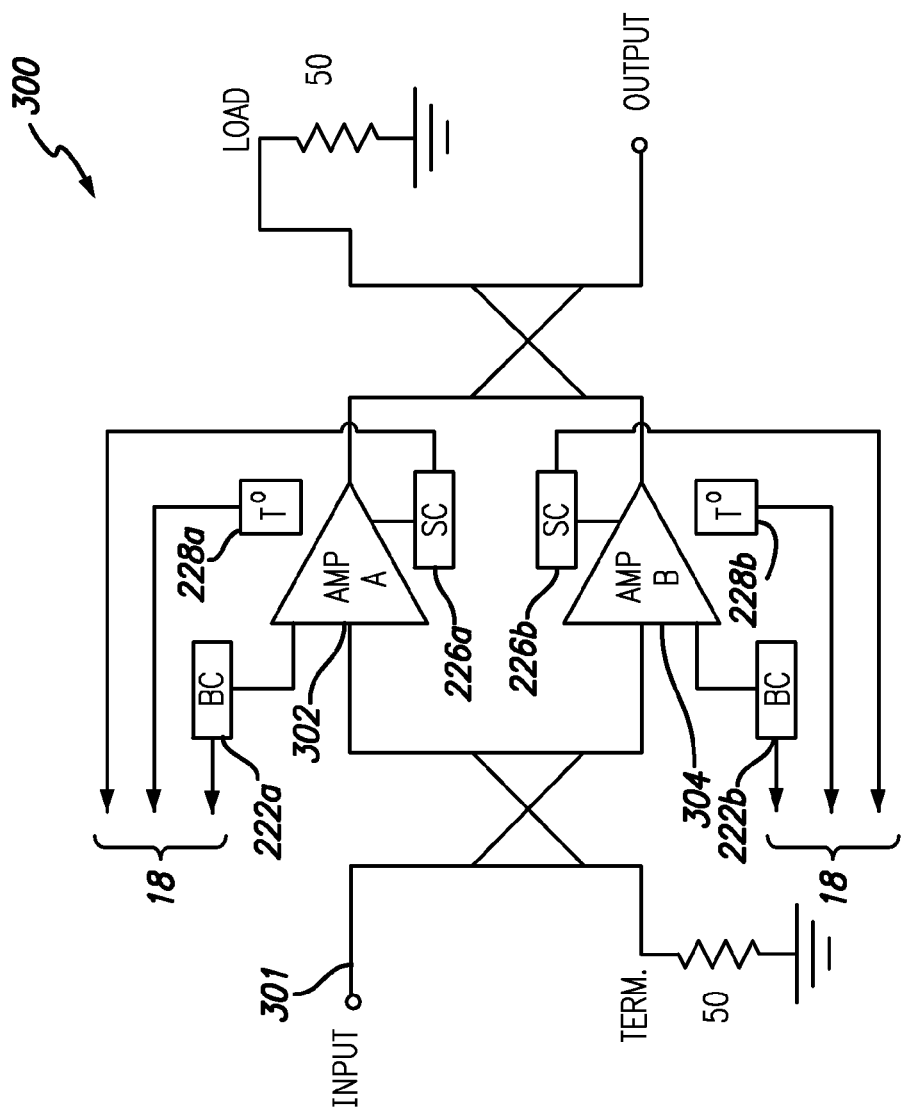
FIG. 4A is a block schematic diagram of an exemplary balanced power amplifier configuration in an embodiment.

Referring to FIG. 4A, an exemplary block schematic diagram of a balanced power amplifier 300 configuration in an embodiment is presented which may comprise part of transceiver subsystem 20 shown in FIG. 1. The balanced power amplifier 300 comprises an input 301, a first amplifier 302, and a second amplifier 304. Temperature sensors 228a and 228b are thermally coupled to the power amplifiers 302 and 304, respectively. Bias circuits 222a and 222b are controlled by a system controller via lines 18 and are both configured for monitoring and applying a bias to power amplifiers 302 and 304. Current sensing circuits 226a and 226b are adapted for measuring currents with the power amplifiers 302 and 304 and communicating the values of the currents to the system controller (60; FIG. 1) via lines 18. A single variable attenuator (216; FIG. 2) may be placed before input 301, or two variable attenuators (not shown) may each be placed before the input of amplifiers 302 and 304.

Figure 4B:
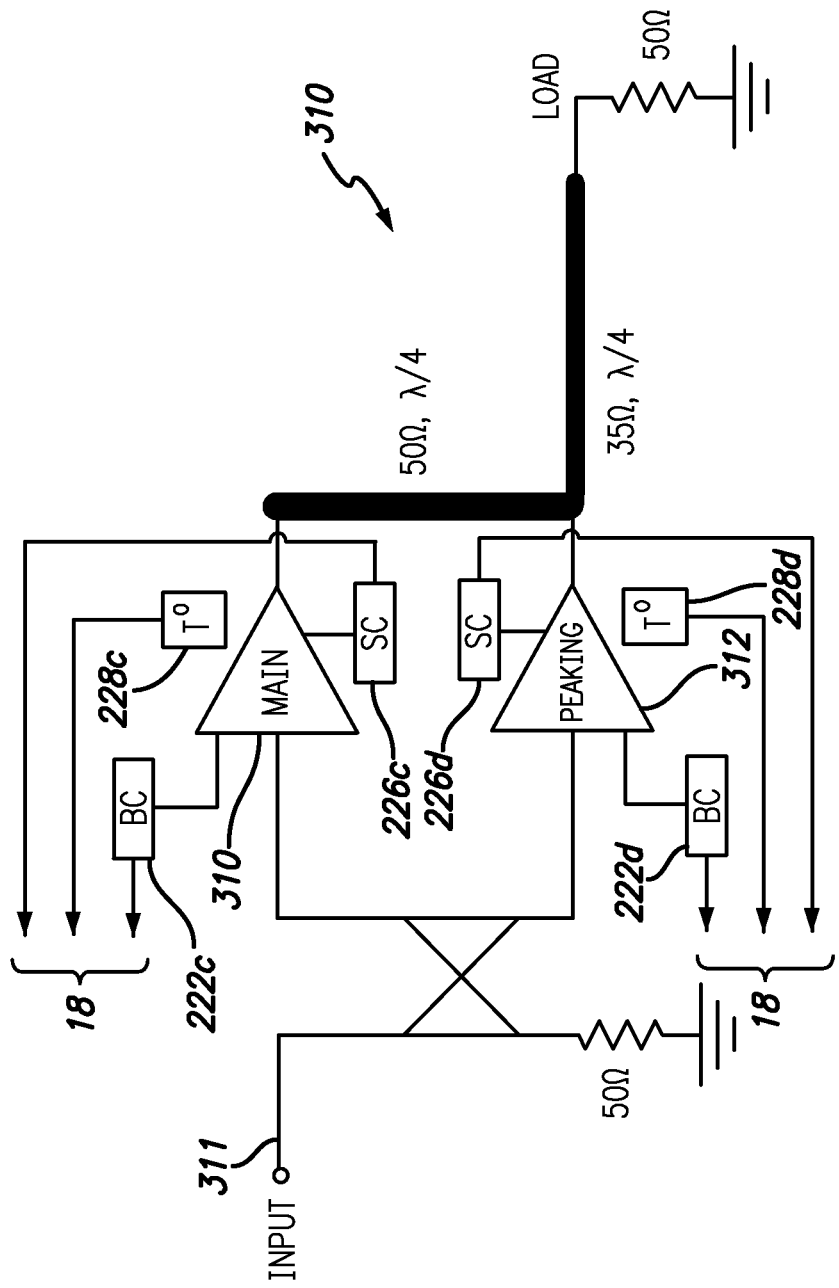
FIG. 4B is a block schematic diagram of an exemplary Doherty amplifier configuration in an embodiment.

FIG. 4B depicts a block schematic diagram of an exemplary Doherty amplifier configuration 310. The Doherty power amplifier 310 comprises an input 311, and a main (first) amplifier 310 and a peaking (second) amplifier 312. Temperature sensors 228c and 228d are thermally coupled to the amplifiers 310 and 312 respectively. Bias circuits 222c and 222d are controlled by a system controller (60; FIG. 1) via lines 18 and are both configured for monitoring and applying a bias to amplifiers 310 and 312. Current sensing circuits 226c and 226d are adapted for measuring currents with the amplifiers 310 and 312 and communicating the values of the currents to the system controller (60; FIG. 1) via lines 18. A single variable attenuator (216; FIG. 2) may be placed before input 311, or two variable attenuators (not shown) may each be placed before the input of amplifiers 310 and 312. The variable attenuator(s) could also be inserted before any driver stages.

Figure 5:
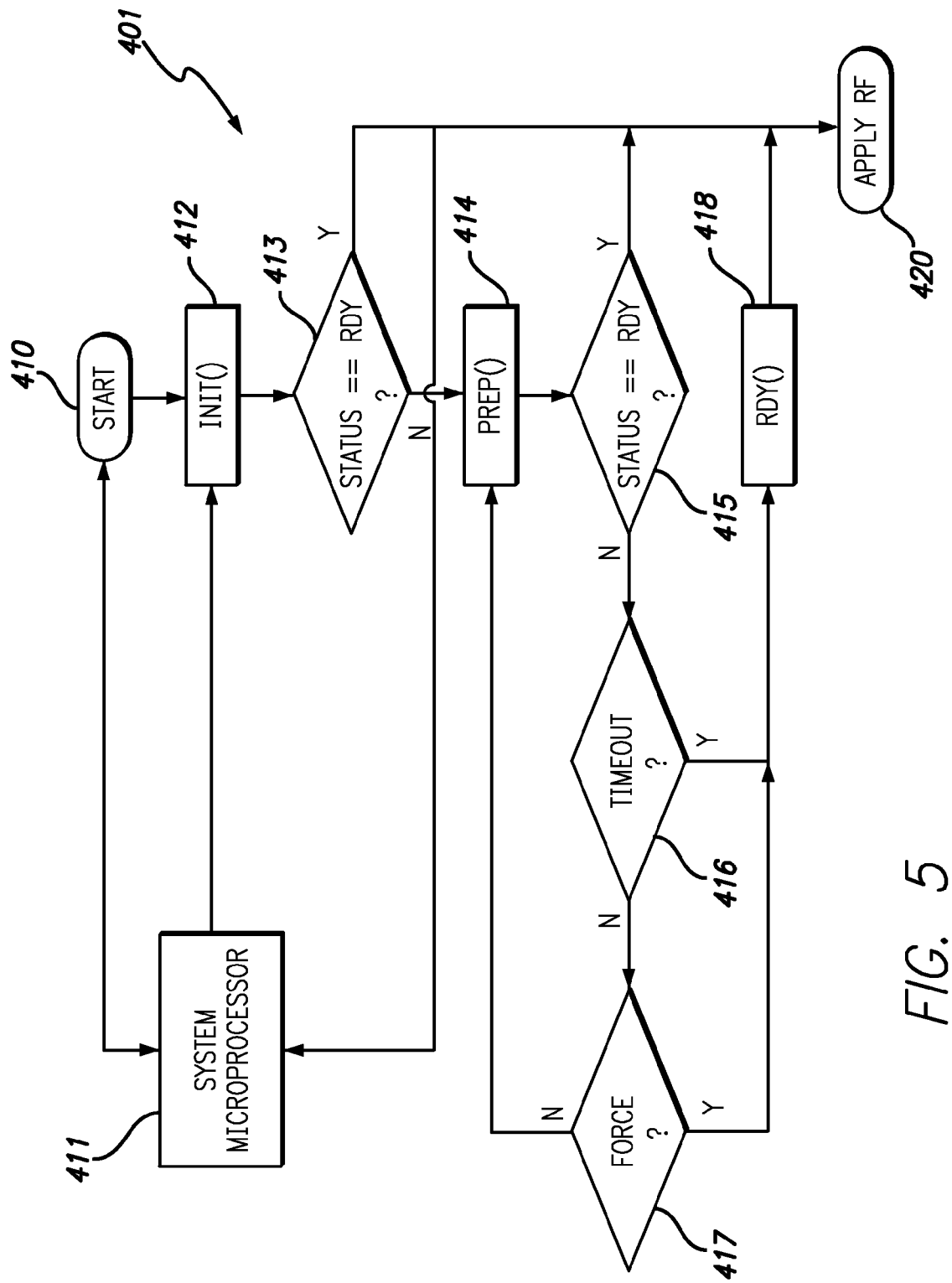
FIG. 5 is a flow diagram of an exemplary power amplifier preparatory phase.

The flow diagram 401 of FIG. 5 illustrates an exemplary procedure implemented under the supervision of the main system controller 411. The microprocessor starts the process flow 410 and begins the "initialization process" (step 412) and sets the appropriate initial currents. The temperature of the PAM is measured at step 413. If the temperature is of the right order, the microprocessor signals the system microcontroller 411 to turn on the RF drive (step 420). If not, the PAM will go through the preparatory phase (step 414) where the quiescent current of one or more amplifiers such as the main amplifier 310 and peaking amplifier 312 of the PAM shown in FIG. 4B are set to "HIGH". A typical "HIGH" current could be equal to main amplifier current at full power (or even higher), but within the safe range of drain current as specified by the device manufacturer for a particular device size. The status check (step 415) will decide if the PAM temperature has reached its normal range. If "YES" it will prompt the system microprocessor to apply the RF (step 420). If "NOT" the controller 411 it will check for a "time-out" (step 416) in which case it will be flagged as "READY". If a "time-out" has occurred, the system controller will force the RF to be applied (step 417). The "TIME-OUT" is a feature that guarantees the system will not dwell in warming up phase for too long if the pallet temperature cannot raise to its nominal value due very low ambient temperatures. If the "TIME-OUT" has not been triggered, the pallet is forced to remain in "PREP" mode (step 414) where the warming continues and the loop repeats until either the nominal temperature is reached or the TIME-OUT is triggered. The limits on "TIME-OUT" window could be set as a function of ambient temperature. So as an example when ambient temperature drops to −40° C., the "TIME-OUT" window would be at its maximum and pre-heat time is longest.

The exemplary process illustrated in FIG. 5 may be implemented in systems 60, 110, 300, and 310 depicted in FIGS. 1, 2, 4A, and 4B as follows. The system controller 60 commands the variable attenuator to decouple RF signals from the power amplifiers (220, 304, 304, 310, or 312). The initialization process (step 412) establishes the appropriate currents in the power amplifiers by the system controller communicating commands to the bias circuits 222, 222a-222b, or 222c-222d. When the systems 110, 300, and 310 are first energized, the temperatures of the amplifiers 220, 302, 304, 310, 312 may not be at the optimal operating temperatures and may exhibit thermal nonlinear performance until the amplifiers are warmed in a preparatory heating phase.

Hence at step 413, the system controller determines the temperatures of the power amplifiers by communicating with temperature sensors 228, 228a-228b, or 228c-228d. If the temperature of the power amplifiers are equal or above a pre-determined threshold, the system controller communicates to the variable attenuators to feed RF signals into the corresponding amplifier. If the temperature of the power amplifier is less than a pre-defined threshold, the system controller instructs the bias circuits (222, 222a-222b, or 222c-222d) to increase the quiescent currents of the power amplifiers. The system controller performs a status check (step 415) by obtaining the current temperature from the temperature sensors (228, 228a-228b, or 228c-228d), and if the temperatures are equal to or greater than a predefined threshold, instructing the variable attenuators to feed RF signals to the power amplifiers. The system controller would also monitor the time that increased quiescent currents were fed to the power amplifiers, and determine whether a time-out has occurred as discussed above. In one or more embodiments, power amplifiers within a pair may be individually monitored and controlled independently of the other power amplifier. In one or more embodiments, the process may be performed at initial powering of the power amplifiers or at time subsequent to the initial powering of the power amplifiers.

The procedure outlined above is a general description of the methodology and by no means limiting to a particular implementation. There are many different algorithms and amplifying devices that can implement the technique described above and achieve the same end results.

The embodiments of the invention outlined above is suited to applications where the radio frequency subsystems including the power amplifier are housed outdoor and therefore, exposed to outside temperatures. The approach described above will lead to a reduction in the system idle time at cold start. This is achieved by preparing the power amplifier while the supervisory system is going through system checks and setup sequences. The overall scheme will shorten the time before the system can accept traffic load.

The foregoing descriptions of preferred embodiments of the invention are purely illustrative and are not meant to be limiting in nature. Those skilled in the art will appreciate that a variety of modifications are possible while remaining within the scope of the present invention.

The present invention has been described primarily as methods and structures for preparing and amplifier employing a preparatory, warming-up phase. In this regard, the methods and structures for preparing an amplifier employing a preparatory, warming-up phase are presented for purposes of illustration and description. Furthermore, the description is not intended to limit the invention to the form disclosed herein. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:

1. A method for stabilizing performance of a power amplifier comprising a first power amplifying device and a second power amplifying device, the method comprising the steps of:
    determining an operating temperature of the first power amplifier device and an operating temperature of the second power amplifier device;
    increasing a quiescent current of the first power amplifier device when the operating temperature of the first power amplifier device is less than a pre-defined level;
    increasing a quiescent current of the second power amplifier device when the operating temperature of the second power amplifier device is less than a pre-defined level;
    feeding an RF signal into the input of the power amplifier when the operating temperature of either or both of the first power amplifier device and the second power amplifier device is greater than or equal to the pre-defined level; and
    adjusting the quiescent current of either or both of the first power amplifier device and the second power amplifier device to its normal bias point when the RF signal is applied.

2. The method for stabilizing performance of a power amplifier as set out in claim 1, further comprising decoupling the RF signal from the input of the power amplifier during initialization.

3. The method for stabilizing performance of a power amplifier as set out in claim 1, further comprising applying, predistortion to the RF signal after the operating temperature of either or both of the first power amplifier device and the second power amplifier device is greater than or equal to the pre-defined level.

4. The method for stabilizing performance of a power amplifier as set out in claim 1, wherein the increased level of the quiescent current corresponds to full power or higher of either or both of the first power amplifier device and the second power amplifier device but within the safety range of drain current as defined by specifications at those power amplifier devices.

5. The method for stabilizing performance of a power amplifier as set out in claim 1, further comprising
    measuring a total time period in which the quiescent current of either or both of the first power amplifier device and the second power amplifier device has been increased;
    comparing the total time period to a pre-defined time; and,
    feeding the RF signal to the input of the power amplifier when the total time period is greater than or equal to the pre-defined time.

6. The method for stabilizing performance of a power amplifier as set out in claim 5, further comprising maintaining the increased level of the quiescent current of either or both of the first power amplifier device and the second power amplifier device when the total time period is less than the pre-defined time.

7. The method for stabilizing performance of a power amplifier as set out in claim 5, wherein the pre-defined time is determined based on an ambient temperature near the power amplifier.

8. The method for stabilizing performance of a power amplifier as set out in claim 1, further comprising:
    monitoring a current of the power amplifier;
    communicating the value of the current of the power amplifier; and,
    varying the quiescent current of either or both of the first power amplifier device and the second power amplifier device based on the value of the current.

9. A power amplifier system comprising:
    a system controller;
    a first power amplifying device amplifying a communication signal to provide a first output signal;
    a first temperature sensor thermally coupled to the first power amplifying device and sensing and communicating the operating temperature of the first power amplifying device to the system controller;
    a first bias circuit providing a first quiescent current to the first power amplifying device, the first bias circuit coupled to and controlled by the system controller;
    a second power amplifying device amplifying a second portion of the communication signal to provide a second output signal;
    a second temperature sensor thermally coupled to the second power amplifying device and sensing and communicating the operating temperature of the second power amplifying device to the system controller; and
    a second bias circuit providing a second quiescent current to the second power amplifying device, the second bias circuit controlled by the system controller,
    wherein the system controller controls the second bias circuit to increase the second quiescent current of the second power amplifying device when the operating temperature is less than a pre-defined level,
    wherein the system controller controls the first bias circuit to increase the first quiescent current of the first power amplifying device when the operating temperature is less than a pre-defined level.

10. The power amplifier system as set out in claim 9, further comprising:
    a first current sensing circuit monitoring a first current of the first power amplifying device, the first current sensing circuit communicating the value of the first current to the system controller,
    wherein the system controller varies the first quiescent current based on the value of the first current.

11. The power amplifier system as set out in claim 9, wherein the first and second power amplifying devices are configured to form a balanced amplifier system.

12. The power amplifier system as set out in claim 9, wherein the first and second power amplifying devices are configured to form a Doherty amplifier system.

13. The power amplifier system as set out in claim 9, further comprising:
    a variable attenuator stage having an input receiving an RF signal and an output coupled to a common input of the first and second power amplifying devices, the variable attenuator stage controlled by the system controller,
    wherein the system controller controls the variable attenuator stage for selectively coupling and decoupling the RF signal to the first and second power amplifying devices.

14. The power amplifier system as set out in claim 9, further comprising:
    a first variable attenuator stage having an input receiving an RF signal and an output coupled to an input of the first amplifying device, the variable attenuator stage controlled by the system controller; and
    a second variable attenuator stage having an input receiving an RF signal and an output coupled to an input of the second power amplifying device, the variable attenuator stage controlled by the system controller;

wherein the system controller selectively couples and decouples the RF signal to the first and second amplifying devices.

* * * * *

UNITED STATES PATENT AND TRADEMARK OFFICE
CERTIFICATE OF CORRECTION

PATENT NO. : 8,928,404 B2  
APPLICATION NO. : 13/468976  
DATED : January 6, 2015  
INVENTOR(S) : Khanifar et al.

Page 1 of 1

It is certified that error appears in the above-identified patent and that said Letters Patent is hereby corrected as shown below:

In the Claims

In column 11, line 31, in Claim 3, after "applying", delete ",", therefor

In column 11, line 41, in Claim 4, delete "at" and insert --of--, therefor

In column 11, line 44, in Claim 5, after "comprising", insert --:--, therefor

Signed and Sealed this  
Twenty-first Day of April, 2015

Michelle K. Lee  
*Director of the United States Patent and Trademark Office*